(12) United States Patent
Chang et al.

(10) Patent No.: US 12,354,950 B2
(45) Date of Patent: Jul. 8, 2025

(54) MIM EFUSE MEMORY DEVICES AND MEMORY ARRAY USING A METAL-BASED LAYER BETWEEN STRUCTURES

(71) Applicant: Taiwan Semiconductor Manufacturing Company Ltd., Hsinchu (TW)

(72) Inventors: Meng-Sheng Chang, Chu-bei (TW); Chia-En Huang, Xinfeng Township (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 18/357,776

(22) Filed: Jul. 24, 2023

(65) Prior Publication Data

US 2023/0371247 A1    Nov. 16, 2023

Related U.S. Application Data

(62) Division of application No. 17/474,257, filed on Sep. 14, 2021, now Pat. No. 12,224,238.

(60) Provisional application No. 63/188,161, filed on May 13, 2021.

(51) Int. Cl.
*H01L 23/525*     (2006.01)
*H10B 20/25*      (2023.01)

(52) U.S. Cl.
CPC ......... *H01L 23/5256* (2013.01); *H10B 20/25* (2023.02)

(58) Field of Classification Search
CPC . H01L 23/525–5258; H01L 2924/1453; G11C 17/14–165; H10B 20/20–25
See application file for complete search history.

(56) References Cited

U.S. PATENT DOCUMENTS

2006/0231921 A1    10/2006    Van Kampen et al.
2017/0345827 A1    11/2017    Chang et al.

*Primary Examiner* — Laura M Menz
*Assistant Examiner* — Candice Chan
(74) *Attorney, Agent, or Firm* — FOLEY & LARDNER LLP

(57) ABSTRACT

A memory device is disclosed. The memory device includes a transistor. The memory device includes a resistor electrically coupled to the transistor, the transistor and the resistor forming an electrical fuse (eFuse) memory cell. The memory device includes a plurality of interconnect structures formed over a source/drain structure of the transistor. The memory device includes a plurality of via structures formed over the source/drain structure of the transistor. The resistor is disposed between the source/drain structure of the transistor and a topmost one of the plurality of interconnect structures. The resistor is formed of titanium nitride (TiN).

20 Claims, 20 Drawing Sheets

MIM EFUSE MEMORY DEVICES AND MEMORY ARRAY USING A METAL-BASED LAYER BETWEEN STRUCTURES

CROSS-REFERENCE TO RELATED APPLICATION

This application is a divisional of U.S. non-provisional application Ser. No. 17/474,257, filed Sep. 14, 2021 (now U.S. Pat. No. 12,224,238), entitled "MIM EFUSE MEMORY DEVICES AND MEMORY ARRAY," which claims priority to and the benefit of U.S. Provisional Application No. 63/188,161, filed May 13, 2021, entitled "A NEW MIM EFUSE MEMORY CELL STRUCTURE," which are incorporated herein by reference in their entireties for all purposes.

BACKGROUND

In general, memory devices may be volatile memory devices and non-volatile memory (NVM) devices. Volatile memory devices can store data while power is provided but may lose the stored data once the power is shut off. A one-time programmable (OTP) memory device is a type of NVM often used for read-only memory (ROM). When the OTP memory device is programmed, the device cannot be reprogrammed. An eFuse memory cell is a type of OTP memory device that includes a one-transistor, one-resistor (1T1R) configuration. As technology continues to advance and follow Moore's law, it is desirable to have devices that have small cell areas.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
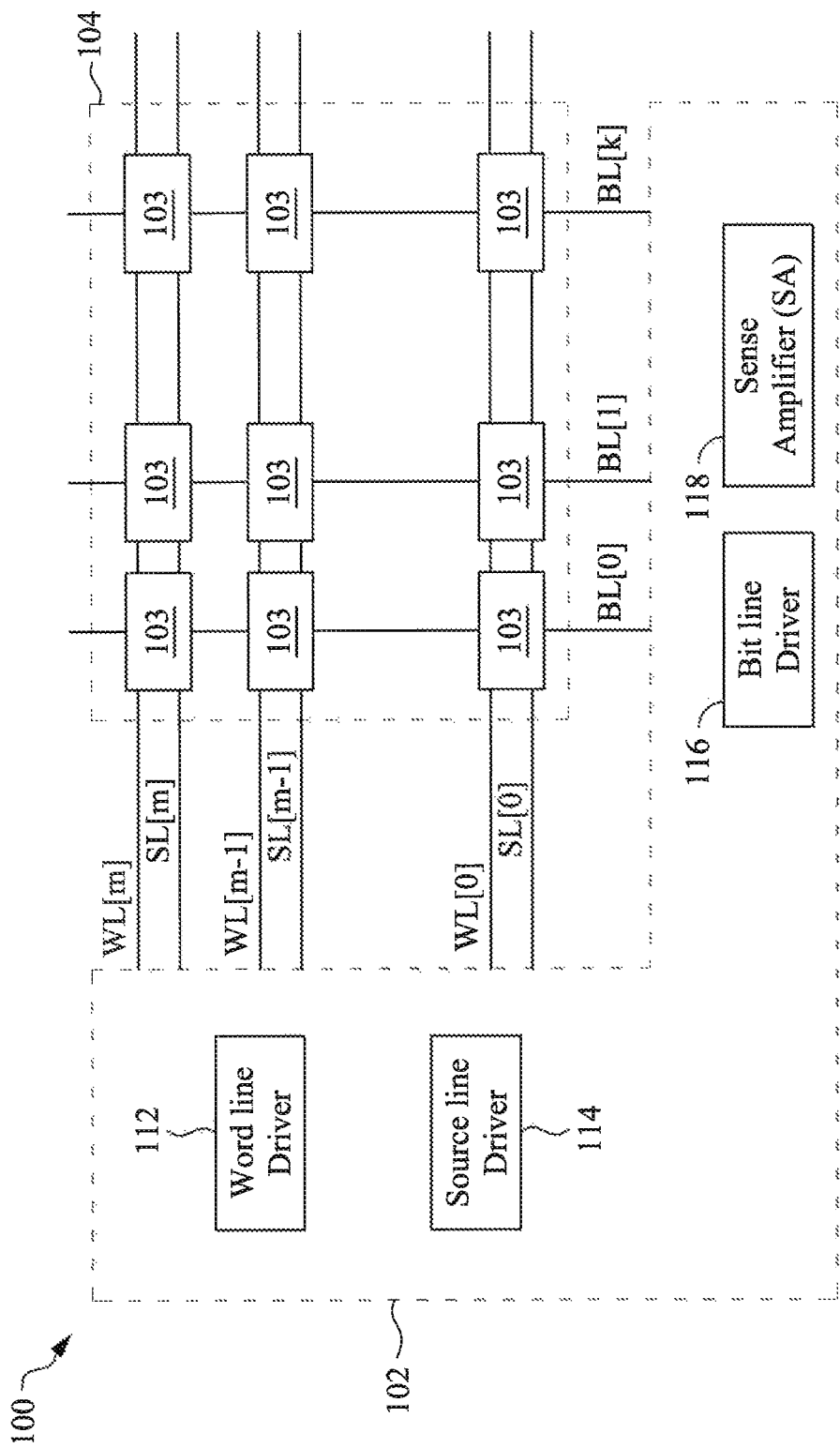
FIG. 1A illustrates a schematic block diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As integrated circuit (IC) technology advances, IC features (e.g., transistor gate length) continue to decrease, thereby allowing for more circuitry to be implemented in an IC. One challenge with implementing OTP memory devices such as, for example, a fuse, an electronic fuse (eFuse), etc., in an IC is that eFuse size reduction has not advanced at nearly the same rate as the reduction in size of transistor features. The eFuse memory is a type of OTP memory that includes a one-transistor, one-resistor (1T1R) configuration. Typically, the resistor is connected to a bit line, and an access transistor is gated by the word line. The resistor includes a metal-insulator-metal (MIM) structure which includes a metal-based material whose resistance can change depending on the voltage difference across the MIM.

A typical eFuse memory cell requires a large programming voltage and/or current in order to adjust the resistance of the resistor of the eFuse memory cell, which often requires a greater cell area. Therefore, the "fuse" i.e., (the resistor) has to be longer and/or thicker in order to properly program the memory cell. Furthermore, the typical resistor of the eFuse memory cell, which is disposed in a metallization layer, e.g., metallization layer M2, may not be scalable for future technology nodes because the M2 parameters can change depending on the technology node. The resistor, which is typically formed during a back-end-of-line (BEOL) process in the M2 layer, requires a high programming voltage which may not be satisfactory for advanced technology nodes. Accordingly, there is a desire to develop an eFuse memory cell that has a smaller cell area and requires a low programming voltage.

In the present disclosure, a novel eFuse memory cell structure can be formed to provide several advantages over the current technology. For example, the MIM fuse (e.g., the resistor fuse material) can be based on titanium nitride (TiN). TiN is sometimes used as a barrier material between a metal and a semiconductor to prevent harmful interactions between the metal and the semiconductor. In the present disclosure, the TiN can be used as the metal fuse for the eFuse memory cell. Furthermore, the MIM fuse can be formed during a back-end-of-line (BEOL) process or a middle-end-of-line (MEOL) process, and be located anywhere between the bit line and the active transistor of the eFuse memory cell. For example, the TiN layer can be formed between the M2 and M3 layers above the source/drain terminal of the access transistor. This can advantageously reduce a cell area of the eFuse memory cell. Furthermore, because of the favorable characters of the TiN material, the metal fuse can be advantageously shorter than the current technology. This can also advantageously help with reducing a programming voltage of the eFuse memory cell.

FIG. 1A illustrates a schematic block diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities.

The memory device 100 comprises at least one memory cell 103 and a controller (also referred to as "control circuit") 102 coupled to control an operation of the memory cell 103. In the example configuration in FIG. 1A, the memory device 100 comprises a plurality of memory cells 103 arranged in a plurality of columns and rows in a memory array 104. The memory device 100 further comprises a plurality of word lines WL[0] to WL[m] extending along the rows, a plurality of source lines SL[0] to SL[m] extending along the rows, and a plurality of bit lines (also referred to as "data lines") BL[0] to BL[k] extending along the columns of the memory cells 103. Each of the memory cells 103 is coupled to the controller 102 by at least one of the word lines, at least one of the source lines, and at least one of the bit lines. Examples of word lines include, but are not limited to, read word lines for transmitting addresses of the memory cells 103 to be read from, write word lines for transmitting addresses of the memory cells 103 to be written to, or the like. In at least one embodiment, a set of word lines is configured to perform as both read word lines and write word lines. Examples of bit lines include read bit lines for transmitting data read from the memory cells 103 indicated by corresponding word lines, write bit lines for transmitting data to be written to the memory cells 103 indicated by corresponding word lines, or the like. In at least one embodiment, a set of bit lines is configured to perform as both read bit lines and write bit lines. In one or more embodiments, each memory cell 103 is coupled to a pair of bit lines referred to as a bit line and a bit line bar. The word lines are commonly referred to herein as WL, the source lines are commonly referred to herein as SL, and the bit lines are commonly referred to herein as BL. Various numbers of word lines and/or bit lines and/or source lines in the memory device 100 are within the scope of various embodiments. In at least one embodiment, the source lines SL are arranged in the columns, rather than in the rows as shown in FIG. 1A. In at least one embodiment, the source lines SL are omitted.

In the example configuration in FIG. 1A, the controller 102 comprises a word line driver 112, a source line driver 114, a bit line driver 116, and a sense amplifier (SA) 118 which are configured to perform at least one of a read operation or a write operation. In at least one embodiment, the controller 102 further includes one or more clock generators for providing clock signals for various components of the memory device 100, one or more input/output (I/O) circuits for data exchange with external devices, and/or one or more controllers for controlling various operations in the memory device 100. In at least one embodiment, the source line driver 114 is omitted.

The word line driver 112 is coupled to the memory array 104 via the word lines WL. The word line driver 112 is configured to decode a row address of the memory cell 103 selected to be accessed in a read operation or a write operation. The word line driver 112 is configured to supply a voltage to the selected word line WL corresponding to the decoded row address, and a different voltage to the other, unselected word lines WL.

The source line driver 114 is coupled to the memory array 104 via the source lines SL. The source line driver 114 is configured to supply a voltage to the selected source line SL corresponding to the selected memory cell 103, and a different voltage to the other, unselected source lines SL.

The bit line driver 116 (also referred as "write driver") is coupled to the memory array 104 via the bit lines BL. The bit line driver 116 is configured to decode a column address of the memory cell 103 selected to be accessed in a read operation or a write operation. The bit line driver 116 is configured to supply a voltage to the selected bit line BL corresponding to the decoded column address, and a different voltage to the other, unselected bit lines BL. In a write operation, the bit line driver 116 is configured to supply a write voltage (also referred to as "program voltage") to the selected bit line BL. In a read operation, the bit line driver 116 is configured to supply a read voltage to the selected bit line BL.

The SA 118 is coupled to the memory array 104 via the bit lines BL. In a read operation, the SA 118 is configured to sense data read from the accessed memory cell 103 and retrieved through the corresponding bit lines BL. The described memory device configuration is an example, and other memory device configurations are within the scopes of various embodiments. In at least one embodiment, the memory device 100 is NVM, and the memory cells 103 are OTP memory cells. Other types of memory are within the scopes of various embodiments. Example memory types of the memory device 100 include, but are not limited to, eFuse, anti-fuse, magnetoresistive random-access memory (MRAM), or the like.

Figure 1B:
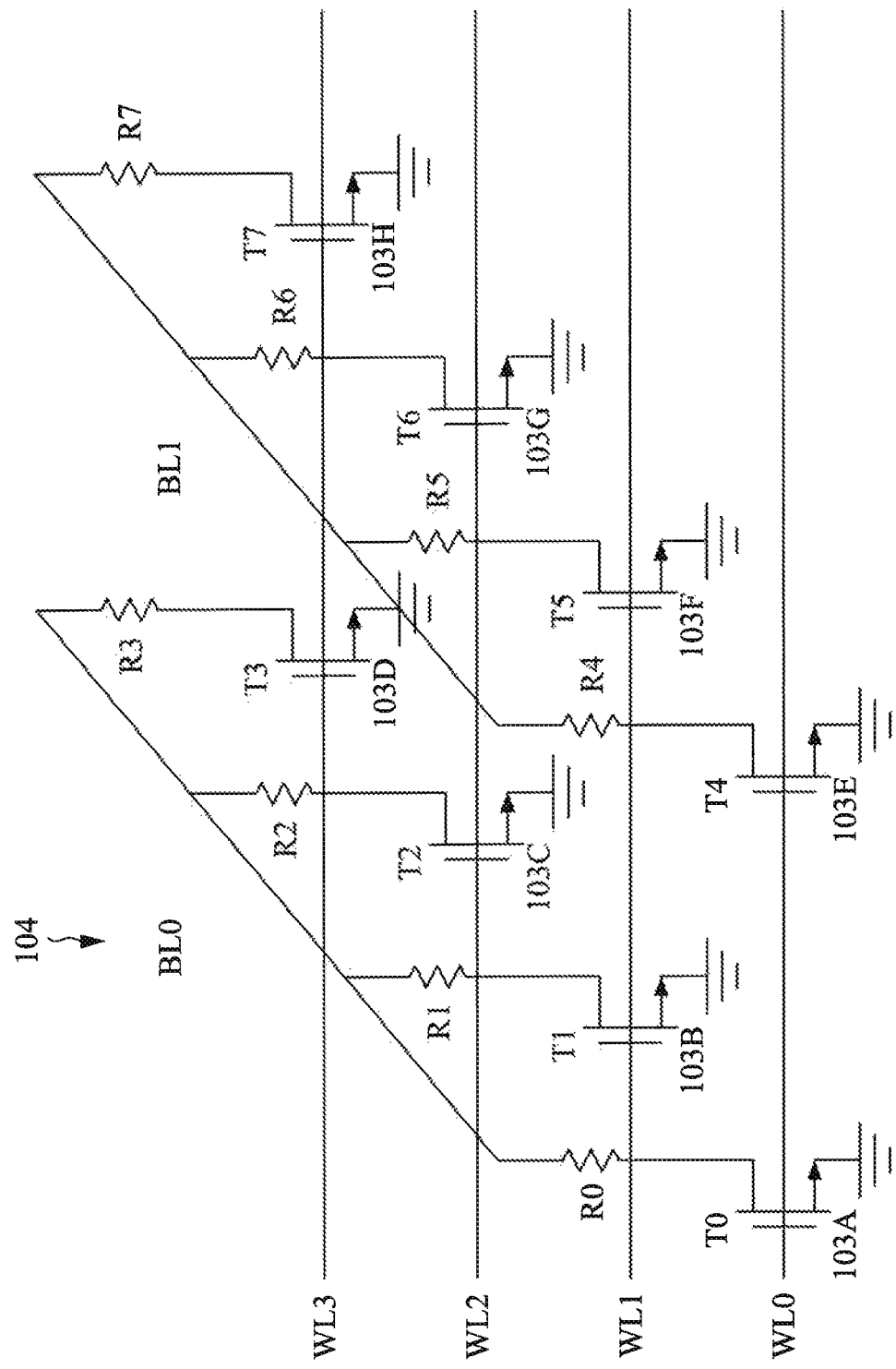
FIG. 1B illustrates a diagram of a memory array of the memory device of FIG. 1A, in accordance with some embodiments.

FIG. 1B illustrates a portion of the memory array 104 (FIG. 1A), in accordance with some embodiments. As shown, the memory array 104 comprises a plurality of memory cells 103, for example, 103A, 103B, 103C, 103D, 103E, 103F, 103G, and 103H. Although eight memory cells are shown in FIG. 1B, it should be understood that the memory array 104 can include any number of memory cells 103, while remaining within the scope of present disclosure.

Each of the memory cells 103A to 103H has a 1T1R configuration with the source line SL grounded, and comprises a transistor and a series coupled in series between a corresponding bit line and SL. For example, the memory cells 103A to 103H correspondingly comprise capacitors resistors R0, R1, R2, R3, R4, R5, R6, and R7, and transistors T0, T1, T2, T3, T4, T5, T6, and T7. The resistors R0 to R3 of the memory cells 103A to 103D are commonly coupled to a bit line BL0. Gate terminals of the transistors T0, T1, T2, T3 are correspondingly coupled to word lines WL0, WL1, WL2, and WL3. The resistors R4-R7 of the memory cells 103E-103H are commonly coupled to a bit line BL1. Gate terminals of the transistors T4-T7 are correspondingly coupled to the word lines WL0, WL1, WL2, WL3. The memory cells 103A-103D commonly coupled to the bit line BL0 correspond to a first string of memory cells, and the memory cells 103E-103H commonly coupled to the bit line BL1 correspond to a second string of memory cells. In at least one embodiment, each of the memory cells 103A-103H corresponds to a memory cell 103, each of the bit lines BL0, BL1 corresponds to a bit line BL, and each of the word lines WL0, WL1, WL2, WL3 corresponds to a word line WL in the memory device 100. In at least one embodiment, one or more advantages described herein are achievable in the memory array 104.

Figure 2:
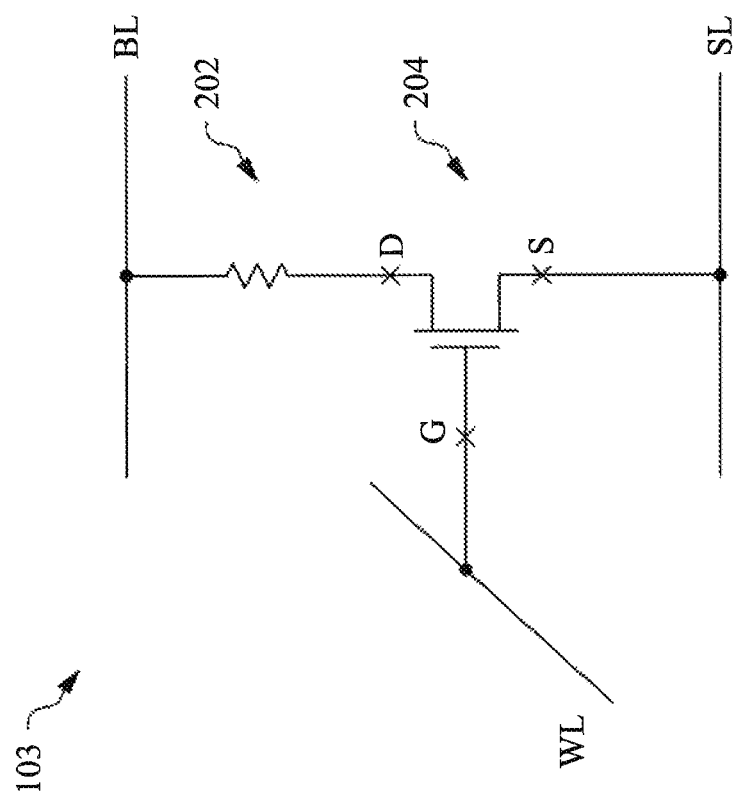
FIG. 2 illustrates an example configuration of the eFuse cell, in accordance with some embodiments.

FIG. 2 illustrates an example configuration of the eFuse cell 103 (FIG. 1A), in accordance with some embodiments. The eFuse cell 103 is implemented as a 1T1R configuration, for example, a fuse resistor 202 serially connected to an access transistor 204. It, however, should be understood that any of various other fuse configurations that exhibit the fuse characteristic may be used by the eFuse cell 103 such as, for example, a 2-diodes-1-resistor (2D1R) configuration, a many-transistors-one-resistor (manyT1R) configuration, etc., while remaining within the scope of the present disclosure.

In accordance with various embodiments of the present disclosure, the fuse resistor 202 is formed of one or more metal structures. For example, the fuse resistor 202 may be one of a number of interconnect structures in one of a number metallization layers that are disposed above the access transistor 204. Specifically, the access transistor 204 is formed over a major surface of a semiconductor substrate, which is sometimes referred to as part of front-end-of-line (FEOL) processing. Over the FEOL processing, a number of metallization layers, each of which includes a number of interconnect (e.g., metal) structures, are typically formed, which are sometimes referred to as part of BEOL processing. During the BEOL processing, or between the FEOL and BEOL processing, there can be processing steps where local electrical connections between transistors and metal gate contacts are formed during the MEOL processing.

With the fuse resistor 202 (of the eFuse cell 103) embodied as a metal structure, the fuse resistor 202 may present an initial resistance value (or resistivity), for example, as fabricated. To program the eFuse cell 103, the access transistor 204 (if embodied as an n-type transistor) is turned on by applying a (e.g., voltage) signal, corresponding to a logic high state, through a WL to a gate terminal of the access transistor 204. Concurrently or subsequently, a high enough (e.g., voltage) signal is applied on one of the terminals of the fuse resistor 202 through a BL. With the access transistor 204 turned on to provide a (e.g., program) path from the BL, through the fuse resistor 202 and access transistor 204, and to a SL, such a high voltage signal can burn out a portion of the corresponding metal structure (the fuse resistor 202), thereby transitioning the fuse resistor 202 from a first state (e.g., a short circuit) to a second state (e.g., an open circuit). Accordingly, the eFuse cell 103 can irreversibly transition from a first logic state (e.g., logic 0) to a second logic state (e.g., logic 1), which can be read out by applying a relatively low voltage signal on the BL and turning on the access transistor 204 to provide a (e.g., read) path.

Figure 3:
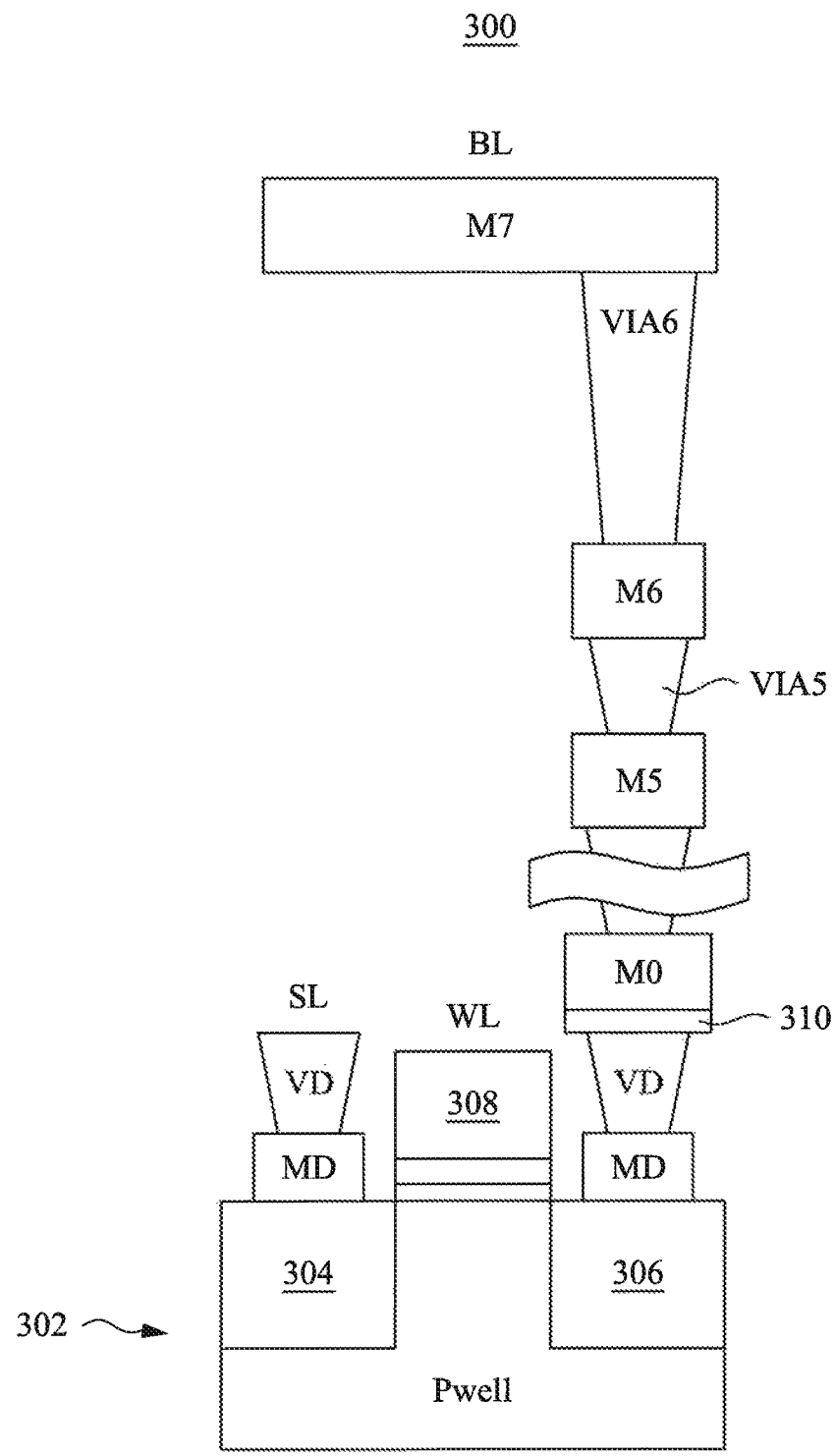
FIGS. 3, 4, 5, 6, 7, 8, 9, 10, 11, 12, and 13 each illustrates a cross-sectional view of a memory cell, in accordance with some embodiments.

FIG. 3 illustrates a cross-sectional view of a memory cell 300 (e.g., eFuse cell 103), in accordance with some embodiments. The memory cell 300 includes a transistor 302 (e.g., access transistor 204) and a metal-based layer 310 (e.g., metal-based layer of the fuse resistor 202).

The memory cell 300 includes a plurality of metallization layers and via structures that is stacked over the drain structure 306. In this disclosure, a metallization layer (or interconnect structure) refers to a layer formed during the MEOL or BEOL process in which multiple metal or interconnect structures are formed and laterally separated from each other by interlayer dielectric (ILD). A top surface and a bottom surface of the ILD can define a boundary of the metallization layer. In the memory cell 300, the metallization layers in the memory cell 300 includes interconnect structures MD, M0, M1, M2, M3, M3, M4, M5, M6 and M7, which are each formed in their respective metallization layers. Although a certain number of interconnect structures are formed in FIG. 3, embodiments are not limited thereto, and fewer or more metallization layers and interconnect structures can be formed. Furthermore, a plurality of vias structures VD, VIA0, VIA1, VIA2, VIA3, VIA4, VIA5, and VIA6 are formed over the drain structure 306 and electrically connecting adjacent interconnect structures to each other. For example, the via structure VIA1 electrically connects the interconnect structure M0 to the interconnect structure M1, the via structure VIA2 electrically connects the interconnect structure M1 to the interconnect structure M2, and so on and so forth.

The transistor 302 includes an n-type transistor, but embodiments are not limited thereto. The transistor 302 is can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

The transistor 302 includes a source structure 304 (e.g., source of access transistor 204), a drain structure 306 (e.g., drain of access transistor 204), and a gate structure 308 (e.g., gate of access transistor 204). The source structure 304 can be electrically connected to a SL (e.g., SL of FIG. 2), and the gate structure 308 can be connected to a WL (e.g., WL of FIG. 2). The drain structure 306 can be electrically connected to a BL (e.g., BL of FIG. 2) through the via structures VD-VIA6 and the interconnect structures MD-M7.

The metal-based layer 310 can include a metal-based layer formed of, but not limited to, TiN. Furthermore, the metal-based layer 310 can include material including tantalum nitride (TaN), alloy of Ti and TiN, alloy of Ta and TaN, or combinations thereof. Although the metal-based layer 310 is shown to be located between certain structures/layers in FIG. 3 (e.g., between via structure fVD and interconnect structure M0), embodiments are not limited thereto, and the metal-based layer 310 can be located anywhere between the transistor 302 and the BL. For example, the metal-based layer 310 can be located anywhere between a source/drain terminal (drain of FIG. 2) of the transistor 302 and the BL.

Figure 4:
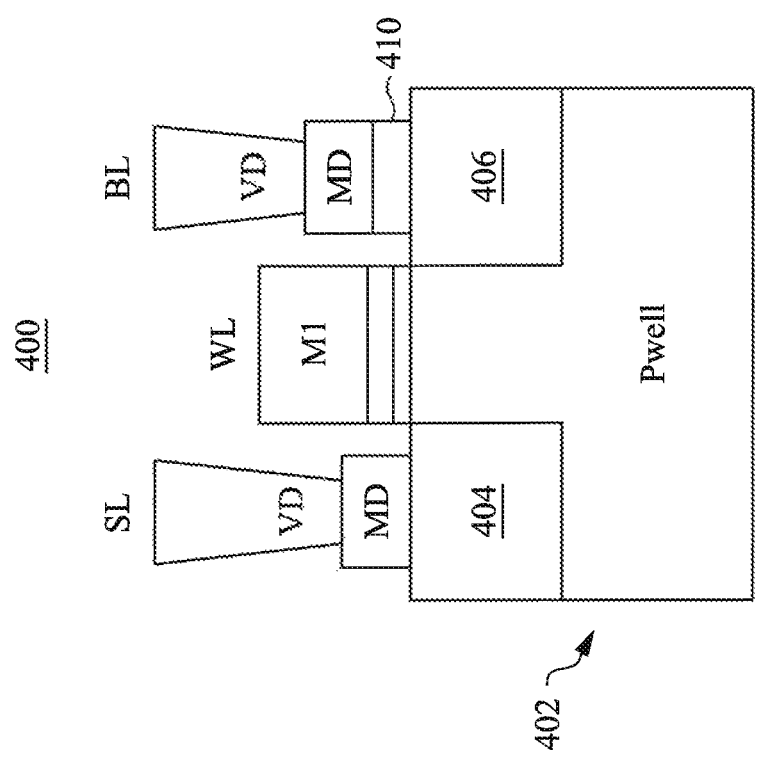

FIG. 4 illustrates a cross-sectional view of a memory cell 400 (e.g., eFuse cell 103), in accordance with some embodiments. The memory cell 400 includes an eFuse memory cell including a transistor 402 (e.g., transistor 302) and a metal-based layer 410 (e.g., metal-based layer 310). The memory cell 400 is similar to the memory cell 300 except that the metal-based layer 410 is located between a drain structure 406 of the transistor 402 and the interconnect structure MD. For example, the metal-based layer 410 is disposed on a top surface of the drain structure 406, and the interconnect structure MD is disposed on a top surface of the metal-based layer 410. Accordingly, the metal-based layer 410 can be formed during a MEOL process.

Figure 5:
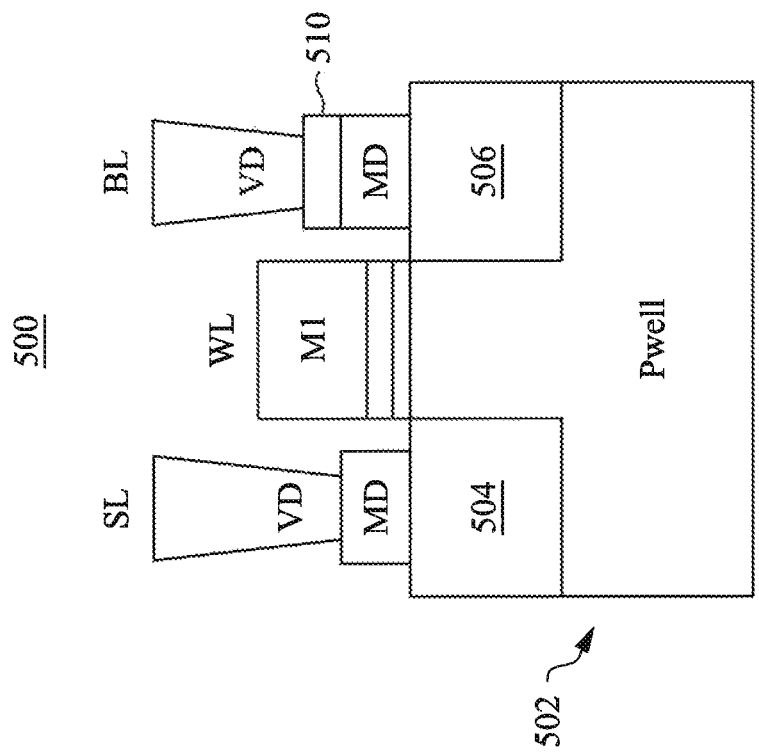

FIG. 5 illustrates a cross-sectional view of a memory cell 500 (e.g., eFuse cell 103), in accordance with some embodiments. The memory cell 500 includes an eFuse memory cell including a transistor 502 (e.g., transistor 302) and a metal-based layer 510 (e.g., metal-based layer 310). The memory cell 500 is similar to the memory cell 300 except that the metal-based layer 510 is located between the interconnect structure MD and the via structure VD. For example, the metal-based layer 510 is disposed on a top surface of the interconnect structure MD, and the via structure VD is disposed on a top surface of the metal-based layer 510. Accordingly, the metal-based layer 510 can be formed during a MEOL process.

Figure 6:
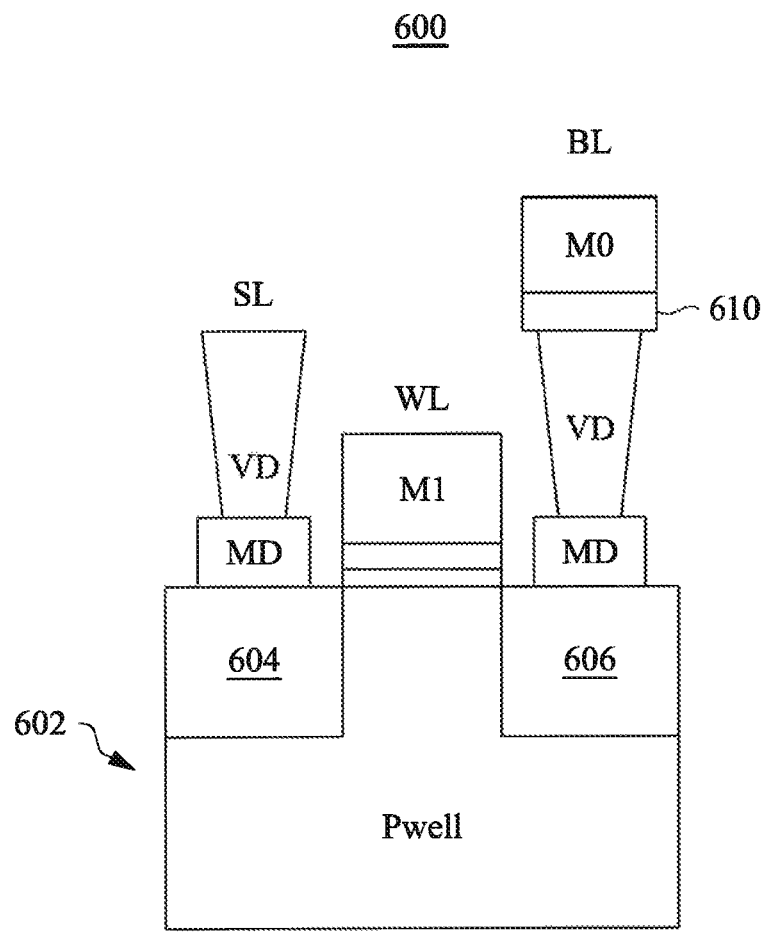

FIG. 6 illustrates a cross-sectional view of a memory cell 600 (e.g., eFuse cell 103), in accordance with some embodiments. The memory cell 600 includes an eFuse memory cell including a transistor 602 (e.g., transistor 302) and a metal-based layer 610 (e.g., metal-based layer 310). The memory cell 600 is similar to the memory cell 300 except that the metal-based layer 610 is located between the via structure VD and the interconnect structure M0. For example, the metal-based layer 610 is disposed on a top surface of the via structure VD, and the interconnect structure M0 is disposed on a top surface of the metal-based layer 610. Accordingly, the metal-based layer 610 can be formed during a BEOL process.

Figure 7:
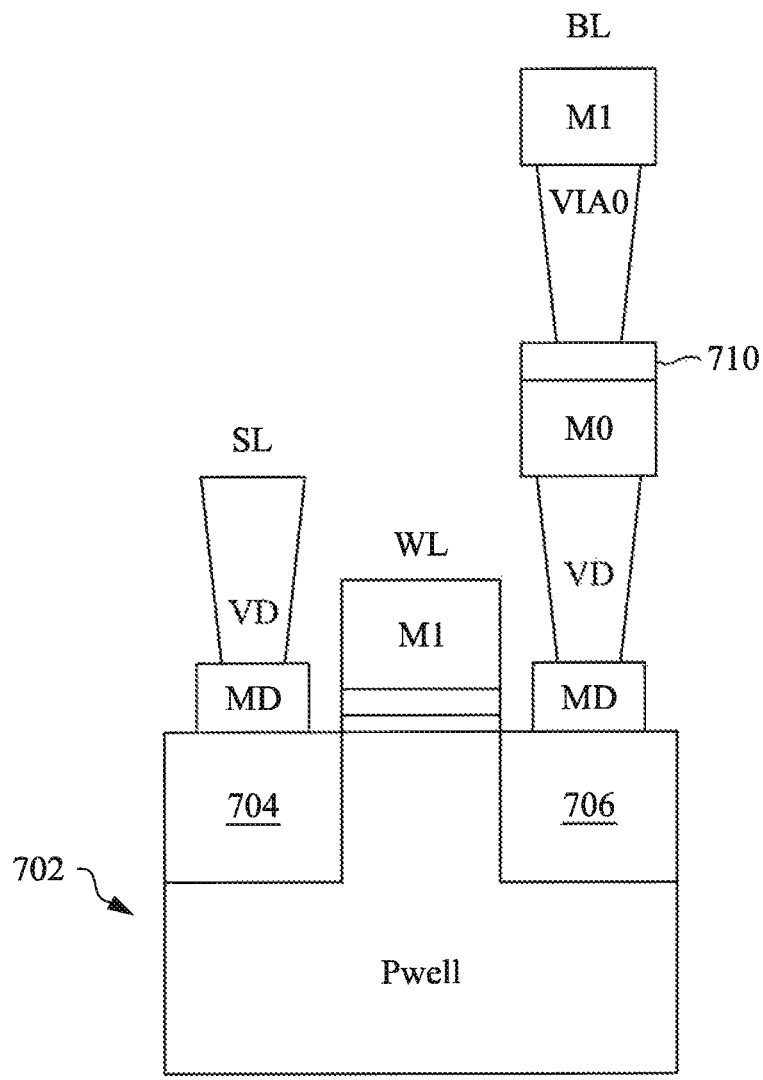

FIG. 7 illustrates a cross-sectional view of a memory cell 700 (e.g., eFuse cell 103), in accordance with some embodiments. The memory cell 700 includes an eFuse memory cell including a transistor 702 (e.g., transistor 302) and a metal-based layer 710 (e.g., metal-based layer 310). The memory cell 400 is similar to the memory cell 300 except that the metal-based layer 410 is located between the interconnect structure M0 and the via structure VIA0. For example, the metal-based layer 710 is disposed on a top surface of the interconnect structure M0, and the via structure VIA0 is disposed on a top surface of the metal-based layer 710. Accordingly, the metal-based layer 710 can be formed during a BEOL process.

Figure 8:
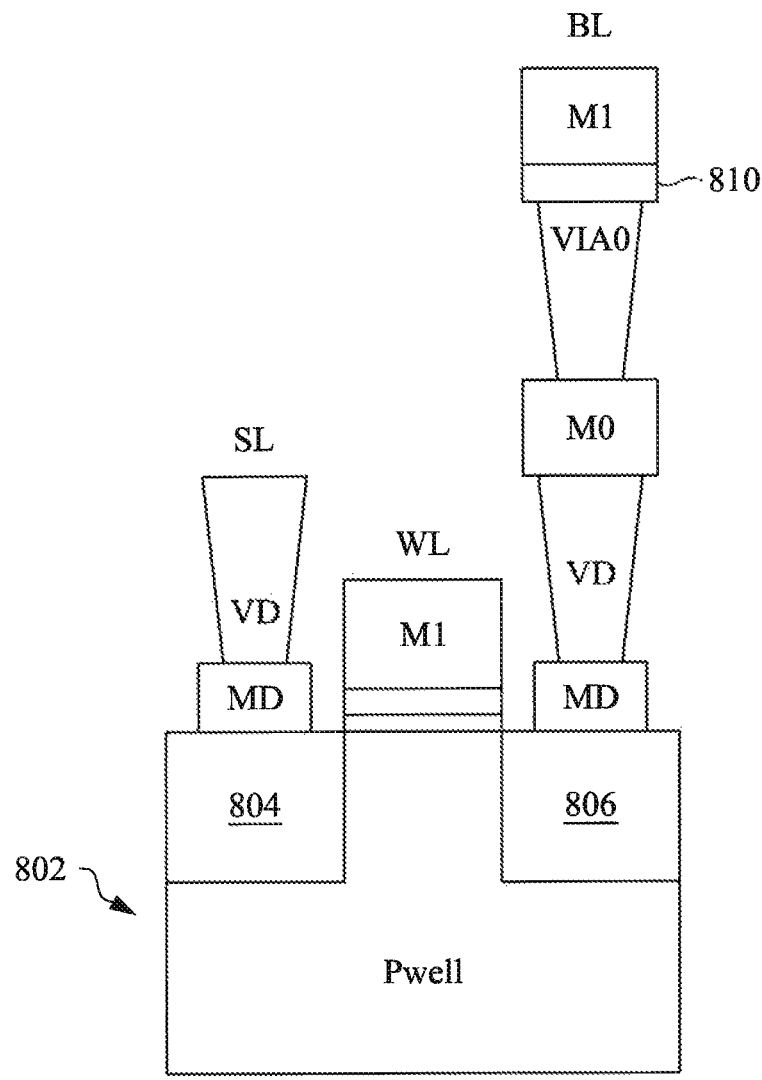

FIG. 8 illustrates a cross-sectional view of a memory cell 800 (e.g., eFuse cell 103), in accordance with some embodiments. The memory cell 800 includes an eFuse memory cell including a transistor 802 (e.g., transistor 302) and a metal-based layer 810 (e.g., metal-based layer 310). The memory cell 800 is similar to the memory cell 300 except that the metal-based layer 810 is located between the via structure VIA0 and the interconnect structure M1. For example, the metal-based layer 810 is disposed on a top surface of the via structure VIA0, and the interconnect structure M1 is disposed on a top surface of the metal-based layer 810. Accordingly, the metal-based layer 810 can be formed during a BEOL process.

Figure 9:
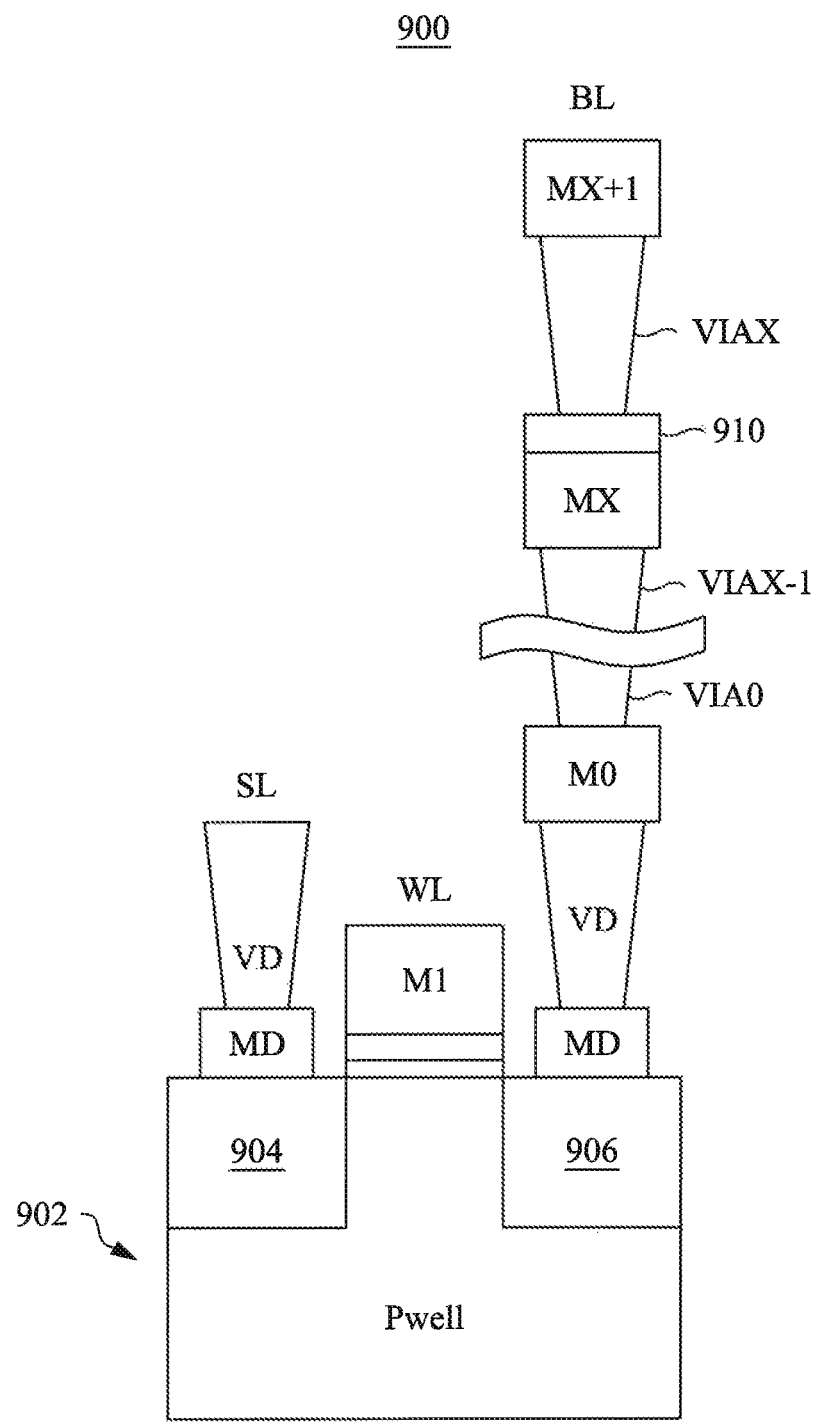

FIG. 9 illustrates a cross-sectional view of a memory cell 900 (e.g., eFuse cell 103), in accordance with some embodiments. The memory cell 900 includes an eFuse memory cell including a transistor 902 (e.g., transistor 302) and a metal-based layer 910 (e.g., metal-based layer 310). The memory cell 900 is similar to the memory cell 300 except that the metal-based layer 910 is located between interconnect structure MX and via structure VIAX, where interconnect structure MX represents any interconnect structure formed over the drain structure 906 and via structure VIAX represents any via structure formed interconnect structure MX. For example, the metal-based layer 910 is disposed on a top surface of the interconnect structure MX, and the via structure VIAX is disposed on a top surface of the metal-based layer 910. Accordingly, the metal-based layer 910 can be formed during a BEOL process.

Figure 10:
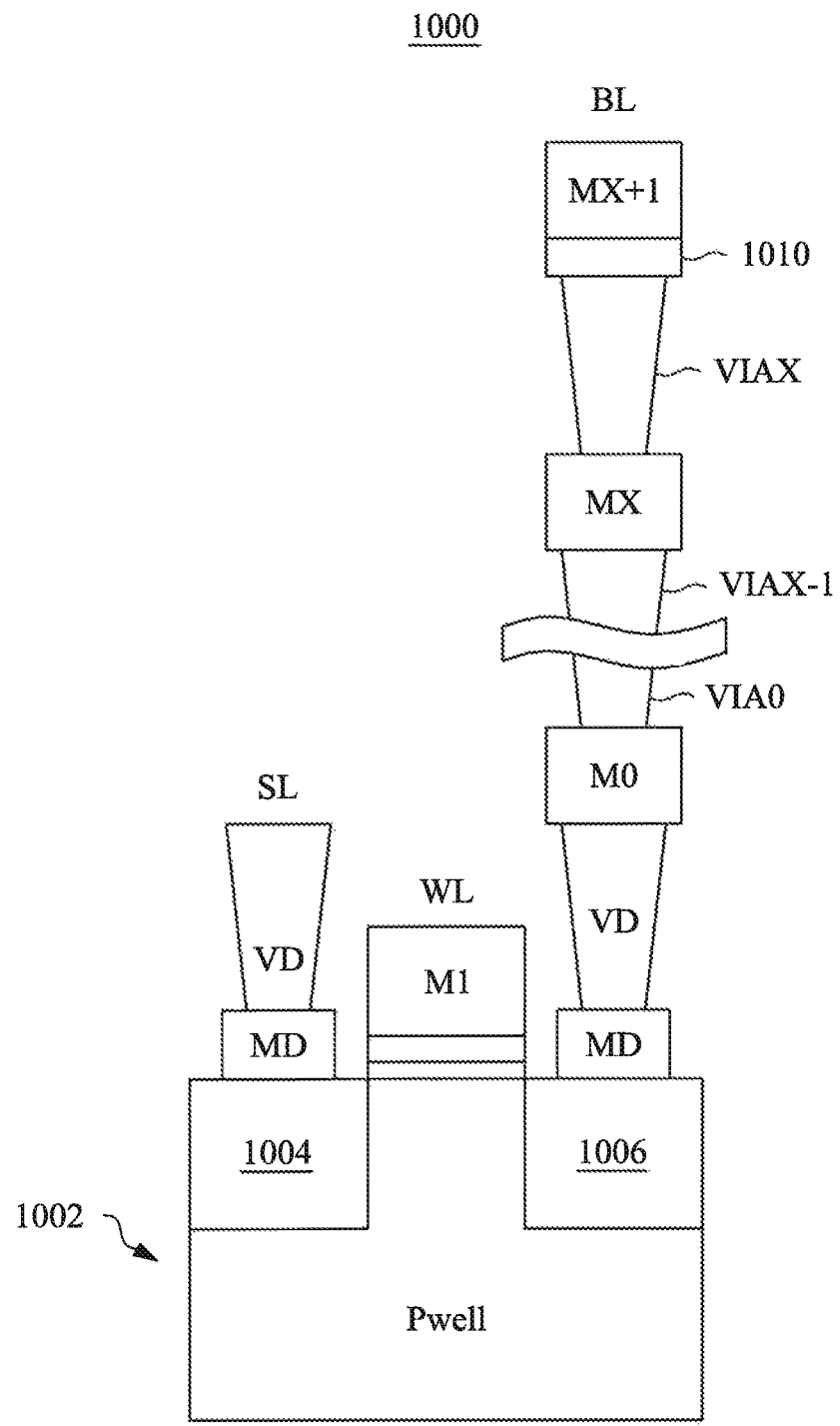

FIG. 10 illustrates a cross-sectional view of a memory cell 1000 (e.g., eFuse cell 103), in accordance with some embodiments. The memory cell 1000 includes an eFuse memory cell including a transistor 1002 (e.g., transistor 302) and a metal-based layer 1010 (e.g., metal-based layer 310). The memory cell 1000 is similar to the memory cell 300 except that the metal-based layer 1010 is located between interconnect structure MX+1 and via structure VIAX, where interconnect structure MX+1 represents any interconnect structure formed over the drain structure 1006 and via structure VIAX represents any via structure disposed below the interconnect structure MX+1. For example, the metal-based layer 1010 is disposed on a top surface of the via structure VIAX, and the interconnect structure MX+1 is disposed on a top surface of the metal-based layer 1010. Accordingly, the metal-based layer 1010 can be formed during a BEOL process.

Figure 11:
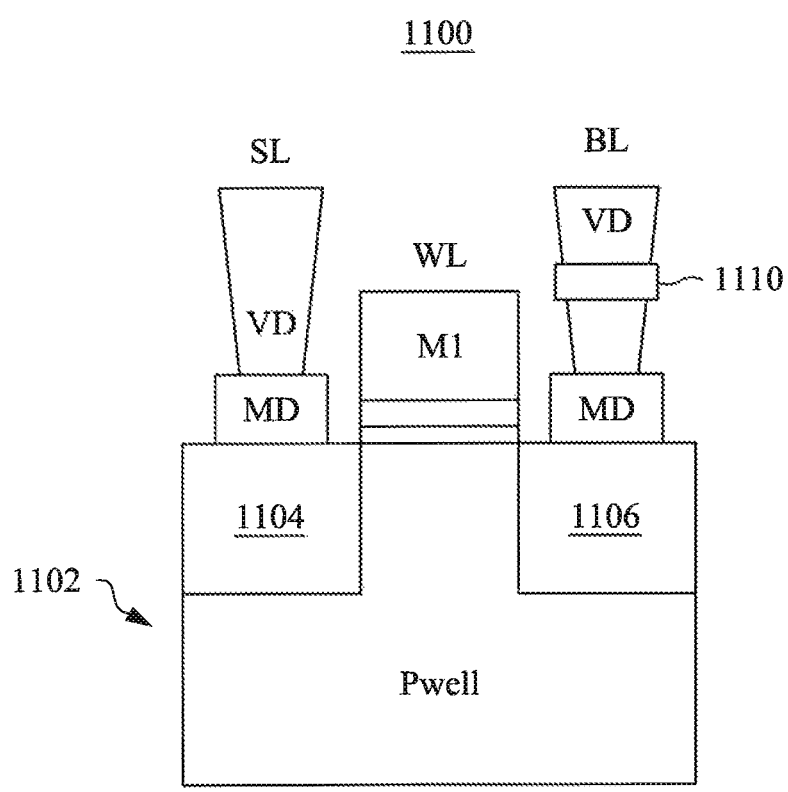

FIG. 11 illustrates a cross-sectional view of a memory cell 1100 (e.g., eFuse cell 103), in accordance with some embodiments. The memory cell 1100 includes an eFuse memory cell including a transistor 1102 (e.g., transistor 302) and a metal-based layer 1110 (e.g., metal-based layer 310). The memory cell 1100 is similar to the memory cell 300 except that the metal-based layer 1110 is located within the via structure VD. For example, the metal-based layer 1110 is disposed on a first portion of the via structure VD, and a second portion of the via structure VD is disposed on the metal-based layer 1110.

Figure 12:
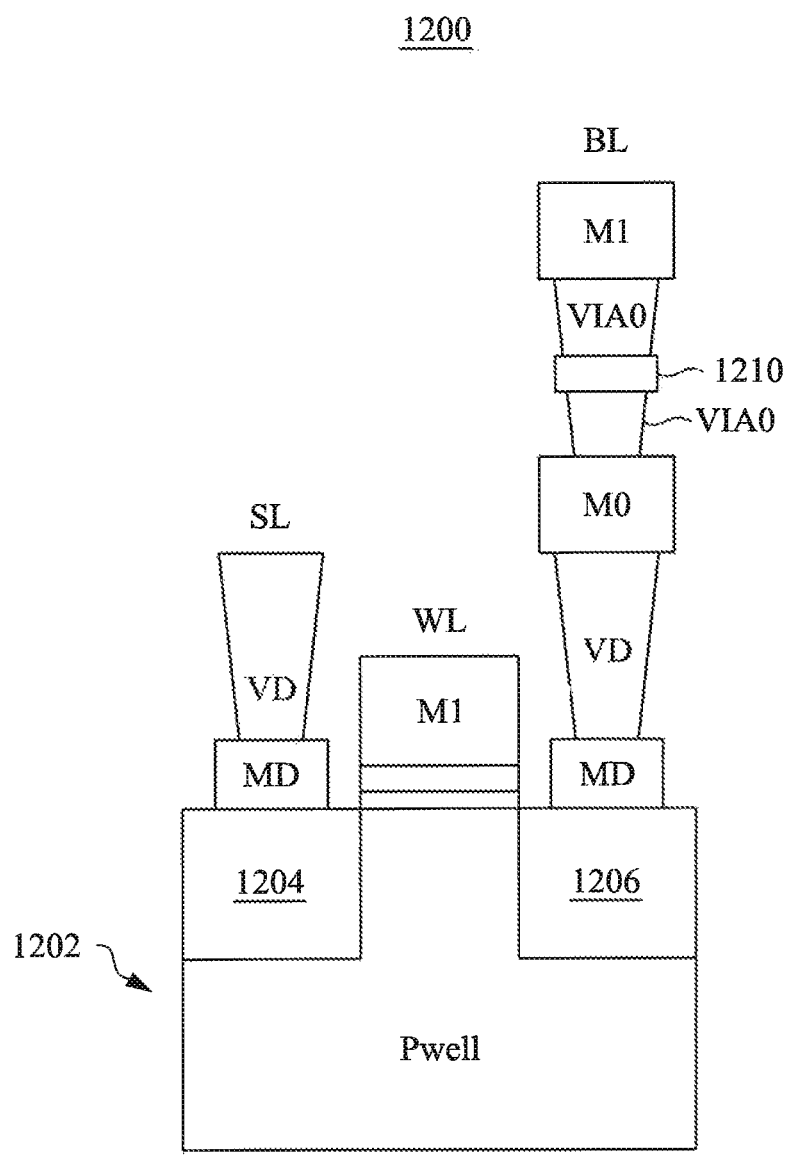

FIG. 12 illustrates a cross-sectional view of a memory cell 1200 (e.g., eFuse cell 103), in accordance with some embodiments. The memory cell 1200 includes an eFuse memory cell including a transistor 1202 (e.g., transistor 302) and a metal-based layer 1210 (e.g., metal-based layer 310). The memory cell 1200 is similar to the memory cell 300 except that the metal-based layer 1210 is located within the via structure VIA0. For example, the metal-based layer 1210 is disposed on a first portion of the via structure VIA0, and a second portion of the via structure VIA0 is disposed on the metal-based layer 1210.

Figure 13:
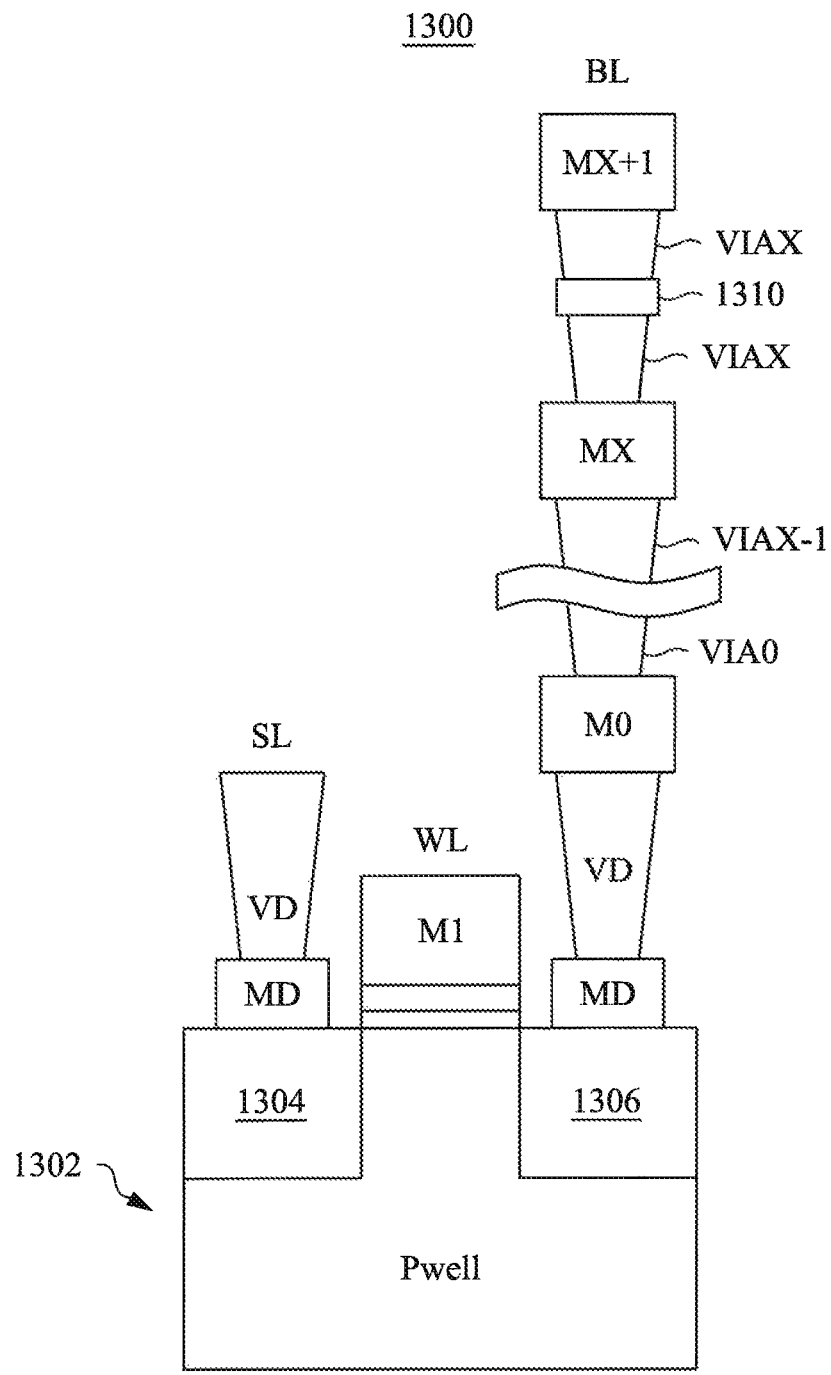

FIG. 13 illustrates a cross-sectional view of a memory cell 1300 (e.g., eFuse cell 103), in accordance with some embodiments. The memory cell 1300 includes an eFuse memory cell including a transistor 1302 (e.g., transistor 302) and a metal-based layer 1310 (e.g., metal-based layer 310). The memory cell 1300 is similar to the memory cell 300 except that the metal-based layer 1310 is located within the via structure VIAX, where via structure VIAX represents any via structure disposed over the drain structure 1306. For example, the metal-based layer 1310 is disposed on a first portion of the via structure VIAX, and a second portion of the via structure VIAX is disposed on the metal-based layer 1310.

Figure 14C:
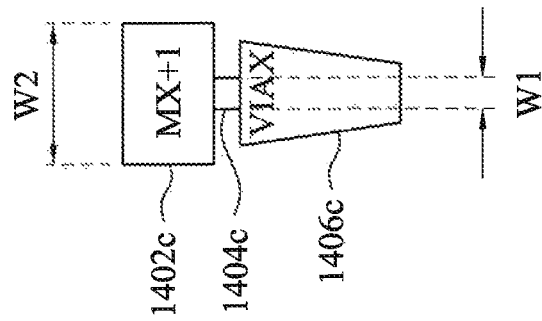
FIGS. 14A, 14B, and 14C each illustrates a cross-sectional view of a portion of a memory cell, in accordance with some embodiments.
Figure 14B:
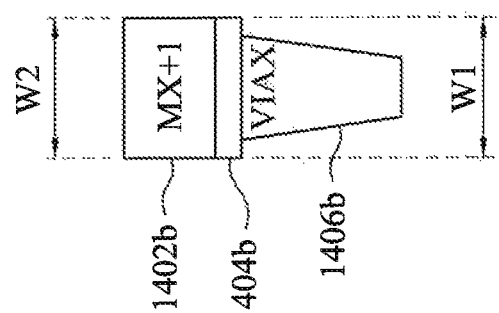
Figure 14A:
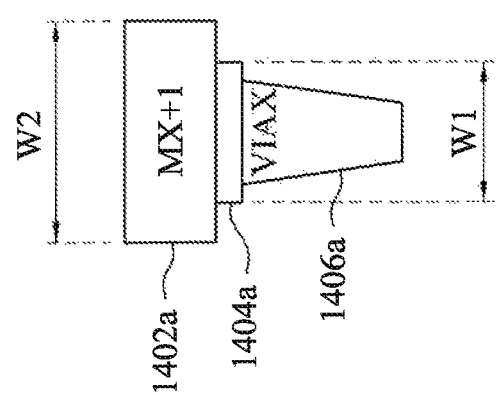

FIGS. 14A-14C each illustrates a cross-sectional view of a portion of a memory cell (e.g., memory cell 600, 800, 1000), in accordance with some embodiments. Referring to FIG. 14A, the portion includes an interconnect structure 1402a (e.g., interconnect structure MX+1), a metal-based layer 1404a (e.g., metal-based layer 610, 804, 1004), and a via structure 1406a (e.g., via structure VIAX). Referring to FIG. 14B, the portion includes an interconnect structure 1402b (e.g., interconnect structure MX+1), a metal-based layer 1404b (e.g., metal-based layer 610, 804, 1004), and a via structure 1406b (e.g., via structure VIAX). Referring to FIG. 14C, the portion includes an interconnect structure 1402c (e.g., interconnect structure MX+1), a metal-based layer 1404c (e.g., metal-based layer 610, 804, 1004), and a via structure 1406c (e.g., via structure VIAX).

Each of the metal-based layers 1404a, 1404b, and 1404c has a width W1. The interconnect structures 1402a, 1402b, and 1402*c* has a bottom surface with a width W2. In the FIG. 14B embodiment, W2 is substantially the same as W1. In the FIGS. 14A and 14C embodiments, W1 is less than W2. In the FIG. 14A embodiment, the ratio between the W1 and W2 is about 0.6, whereas the ratio is about 0.2 in the FIG. 14C embodiment. However, the ratios are not limited thereto. For example, the ratio can be any number between 0 and 1.

Figure 15C:
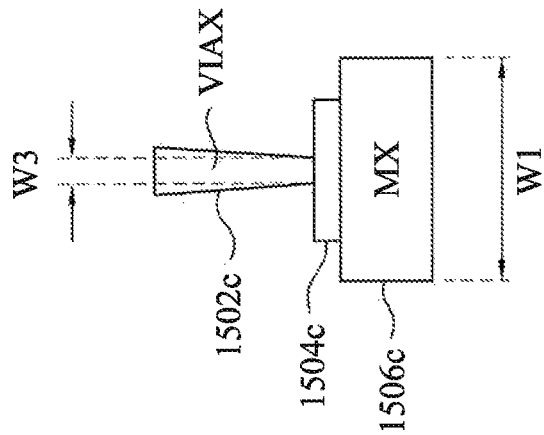
FIGS. 15A, 15B, and 15C each illustrates a cross-sectional view of a portion of another memory cell, in accordance with some embodiments.
Figure 15B:
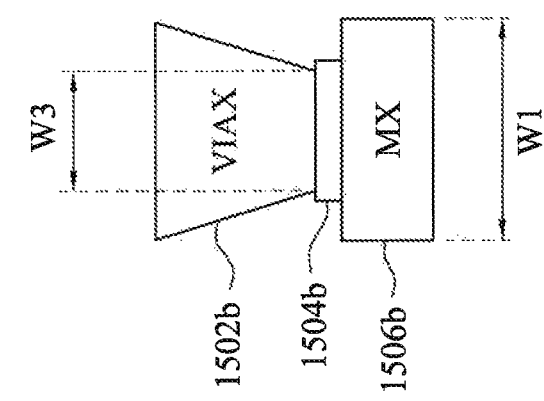
Figure 15A:
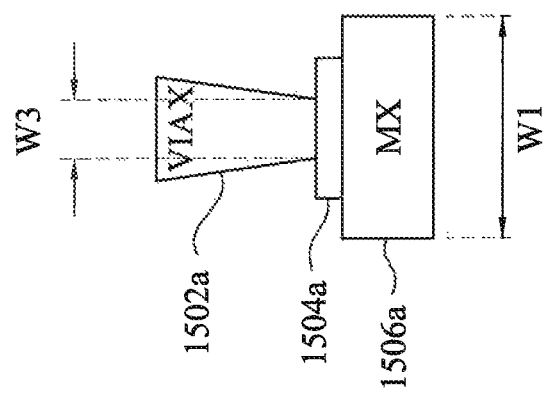

FIGS. 15A-15C each illustrates a cross-sectional view of a portion of a memory cell (e.g., memory cell 700, 900), in accordance with some embodiments. Referring to FIG. 15A, the portion includes a via structure 1502*a* (e.g., via structure VIAX), a metal-based layer 1504*a* (e.g., metal-based layer 710, 904), and an interconnect structure 1506*a* (e.g., interconnect structure MX). Referring to FIG. 15B, the portion includes a via structure 1502*b* (e.g., via structure VIAX), a metal-based layer 1504*b* (e.g., metal-based layer 710, 904), and an interconnect structure 1506*b* (e.g., interconnect structure MX). Referring to FIG. 15C, the portion includes a via structure 1502*c* (e.g., via structure VIAX), a metal-based layer 1504*c* (e.g., metal-based layer 710, 904), and an interconnect structure 1506*c* (e.g., interconnect structure MX).

Each of the metal-based layers 1504*a*, 1504*b*, and 1504*c* has a width W1. The via structures 1502*a*, 1502*b*, and 1502*c* has a bottom surface with a width W3. In the FIG. 15B embodiment, W3 is substantially the same as W1. In the FIGS. 15A and 15C embodiments, W3 is less than W1. In the FIG. 15A embodiment, the ratio between the W3 and W1 is about 0.6, whereas the ratio is about 0.2 in the FIG. 15C embodiment. However, the ratios are not limited thereto. For example, the ratio can be any number between 0 and 1.

Figure 16C:
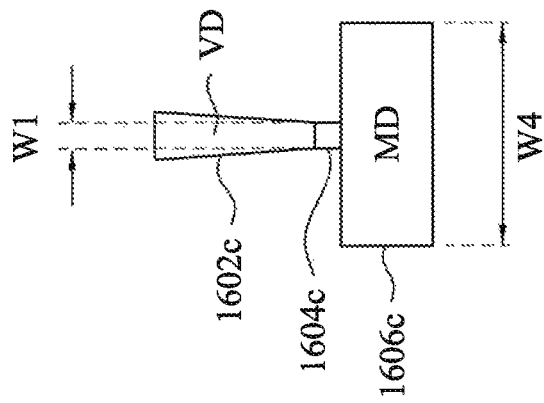
FIGS. 16A, 16B, and 16C each illustrates a cross-sectional view of a portion of yet another memory cell, in accordance with some embodiments.
Figure 16B:
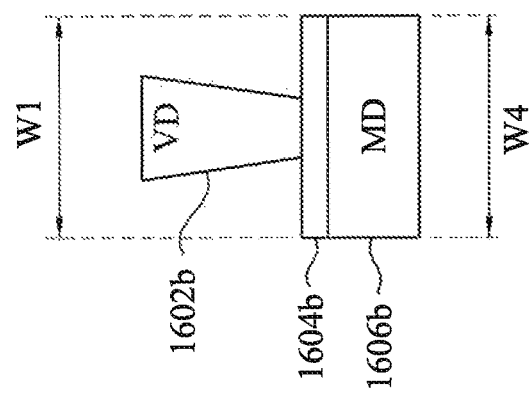
Figure 16A:
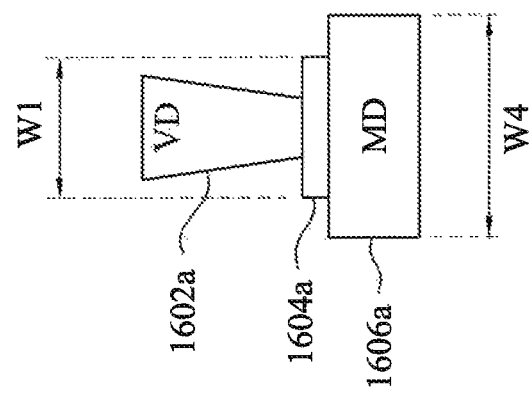

FIGS. 16A-16C each illustrates a cross-sectional view of a portion of a memory cell (e.g., memory cell 500), in accordance with some embodiments. Referring to FIG. 16A, the portion includes a via structure 1602*a* (e.g., via structure VD), a metal-based layer 1604*a* (e.g., metal-based layer 510), and an interconnect structure 1606*a* (e.g., interconnect structure MD). Referring to FIG. 15B, the portion includes a via structure 1602*b* (e.g., via structure VD), a metal-based layer 1604*b* (e.g., metal-based layer 510), and an interconnect structure 1606*b* (e.g., interconnect structure MD). Referring to FIG. 16C, the portion includes a via structure 1602*c* (e.g., via structure VD), a metal-based layer 1604*c* (e.g., metal-based layer 510), and an interconnect structure 1606*c* (e.g., interconnect structure MD).

Each of the metal-based layers 1604*a*, 1604*b*, and 1604*c* has a width W1. The interconnect structures 1606*a*, 1606*b*, and 1606*c* has a top surface with a width W4. In the FIG. 16B embodiment, W4 is substantially the same as W1. In the FIGS. 16A and 16C embodiments, W4 is less than W1. In the FIG. 16A embodiment, the ratio between the W1 and W4 is about 0.6, whereas the ratio is about 0.2 in the FIG. 16C embodiment. However, the ratios are not limited thereto. For example, the ratio can be any number between 0 and 1.

Figure 17C:
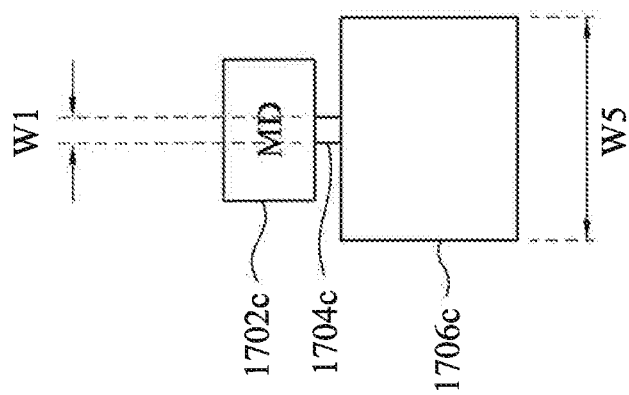
FIGS. 17A, 17B, and 17C each illustrates a cross-sectional view of a portion of still another memory cell, in accordance with some embodiments.
Figure 17B:
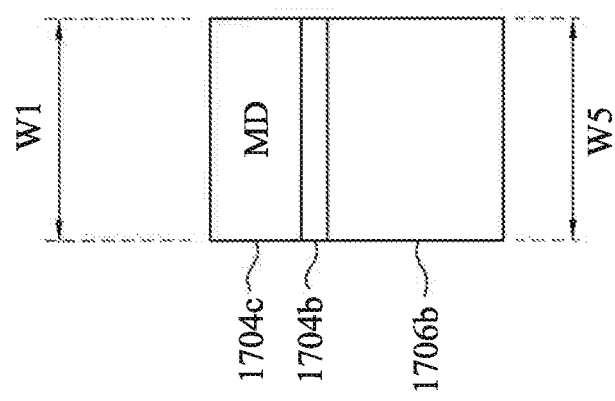
Figure 17A:
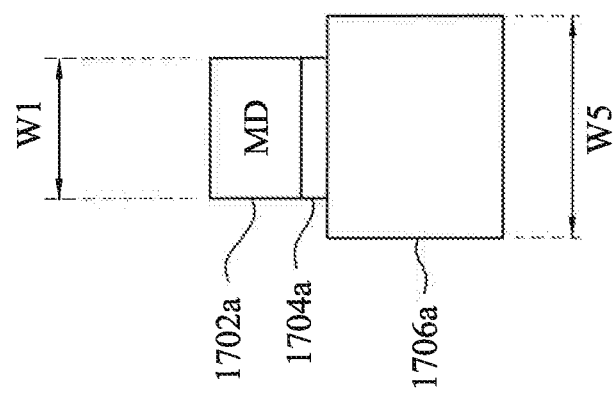

FIGS. 17A-17C each illustrates a cross-sectional view of a portion of a memory cell (e.g., memory cell 400), in accordance with some embodiments. Referring to FIG. 17A, the portion includes an interconnect structure 1702*a* (e.g., interconnect structure MD), a metal-based layer 1704*a* (e.g., metal-based layer 410), and a drain structure 1706*a* (e.g., drain structure 406). Referring to FIG. 17B, the portion includes an interconnect structure 1702*b* (e.g., interconnect structure MD), a metal-based layer 1704*b* (e.g., metal-based layer 410), and a drain structure 1706*b* (e.g., drain structure 406). Referring to FIG. 17C, the portion includes an interconnect structure 1702*c* (e.g., interconnect structure MD), a metal-based layer 1704*c* (e.g., metal-based layer 410), and a drain structure 1706*c* (e.g., drain structure 406).

Each of the metal-based layers 1704*a*, 1704*b*, and 1704*c* has a width W1. The drain structures 1706*a*, 1706*b*, and 1706*c* has a top surface with a width W5. In the FIG. 17B embodiment, W5 is substantially the same as W1. In the FIGS. 17A and 17C embodiments, W1 is less than W5. In the FIG. 17A embodiment, the ratio between the W1 and W5 is about 0.6, whereas the ratio is about 0.2 in the FIG. 17C embodiment. However, the ratios are not limited thereto. For example, the ratio can be any number between 0 and 1.

Figure 18:
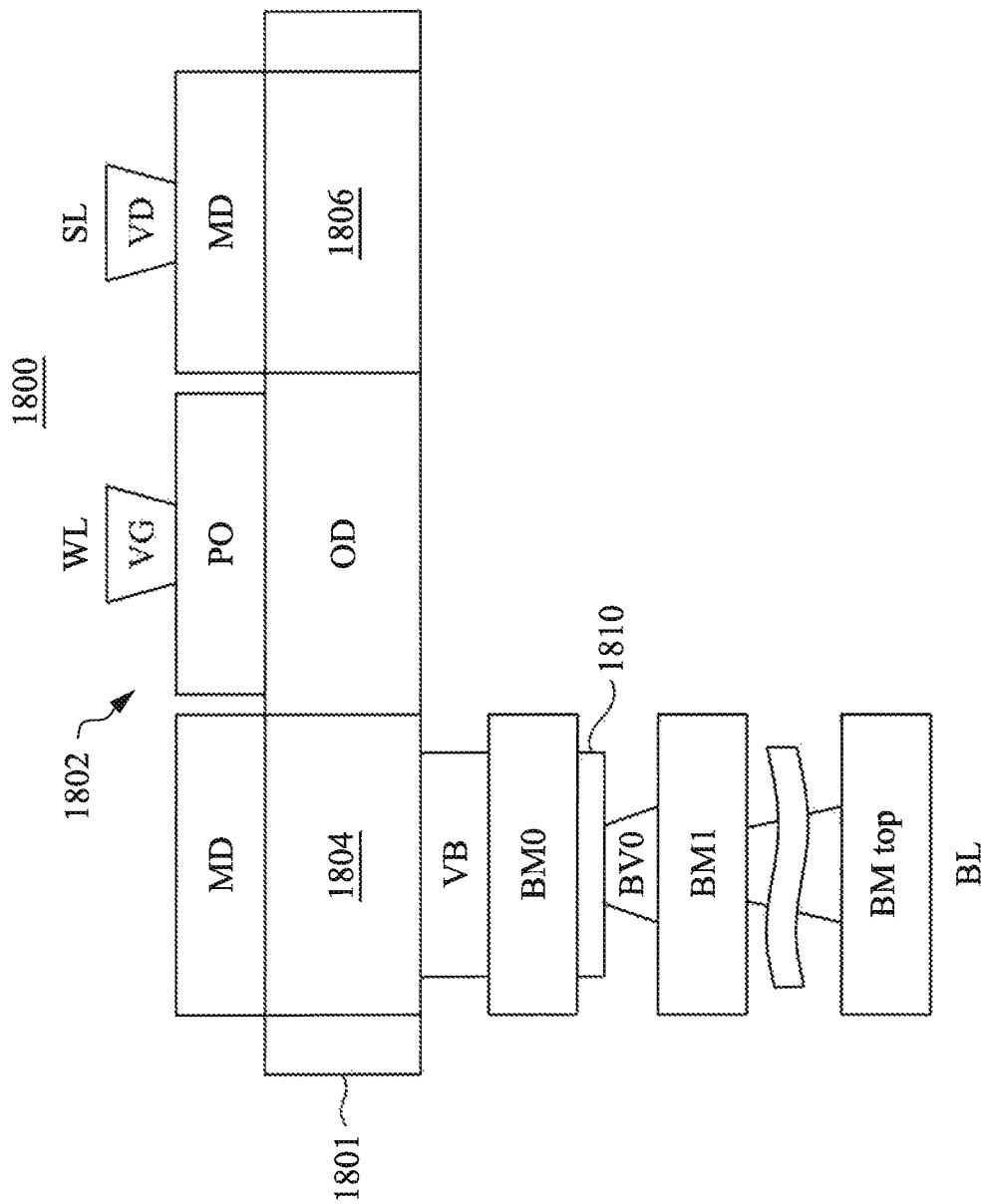
FIGS. 18, 19, and 20 each illustrates a cross-sectional view of a memory cell, in accordance with some embodiments

FIG. 18 illustrates a cross-sectional view of a memory cell 1800, in accordance with some embodiments. The memory cell 1800 incudes a transistor 1802 (e.g., access transistor 204) and a resistor (e.g., fuse resistor 202) including a metal-based layer 1810. The memory cell 1800 is similar to the memory cell 300, except that the memory cell 1800 includes a backside power rail on a second side (e.g., backside) of a substrate 1801 in which the metal-based layer 1810 is disposed.

The transistor 1802 includes a gate structure PO, am S/D structure 1804 (e.g., drain of access transistor 204), and an S/D structure 1802 (e.g., source of access transistor 204). The gate structure PO is electrically connected to the word line WL, the S/D structure 1806 is electrically connected to the source line SL, and the S/D structure 1804 is electrically connected to the bit line BL through a plurality of via structures VB, BV0, BV1, etc. and a plurality of backside interconnect structures BM0, BM1, etc.

The metal-based layer 1810 is disposed between the backside interconnect structure BM0 and the backside via structure BV0. Specifically, the metal-based layer 1810 is disposed below a bottom surface of the backside interconnect structure BM0 and a top surface of the backside via structure BV0. Accordingly, the resistor of the memory cell 1800 includes a first terminal, including the backside interconnect structure BM0 and the backside via structure VB, a second terminal including the backside via structure BV0, the backside interconnect structure BM1, etc. disposed below the metal-based layer 1810, and the metal-based layer 1810 disposed between the first and second terminals. The first terminal is electrically connected to the S/D structure 1804, and the second terminal is electrically connected to the bit line BL.

Although FIG. 18 shows that the metal-based layer 1810 is disposed between the backside interconnect structure BM0 and the backside via structure BV0, embodiments are not limited thereto. For example, the metal-based layer 1810 can be disposed between any backside interconnect structure BMX and any backside via structure BVX that is the first backside via structure disposed below the backside interconnect structure BMX. For example, the metal-based layer 1810 can be disposed between backside interconnect structure BM1 and backside via structure BV1, and so on and so forth.

Figure 19:
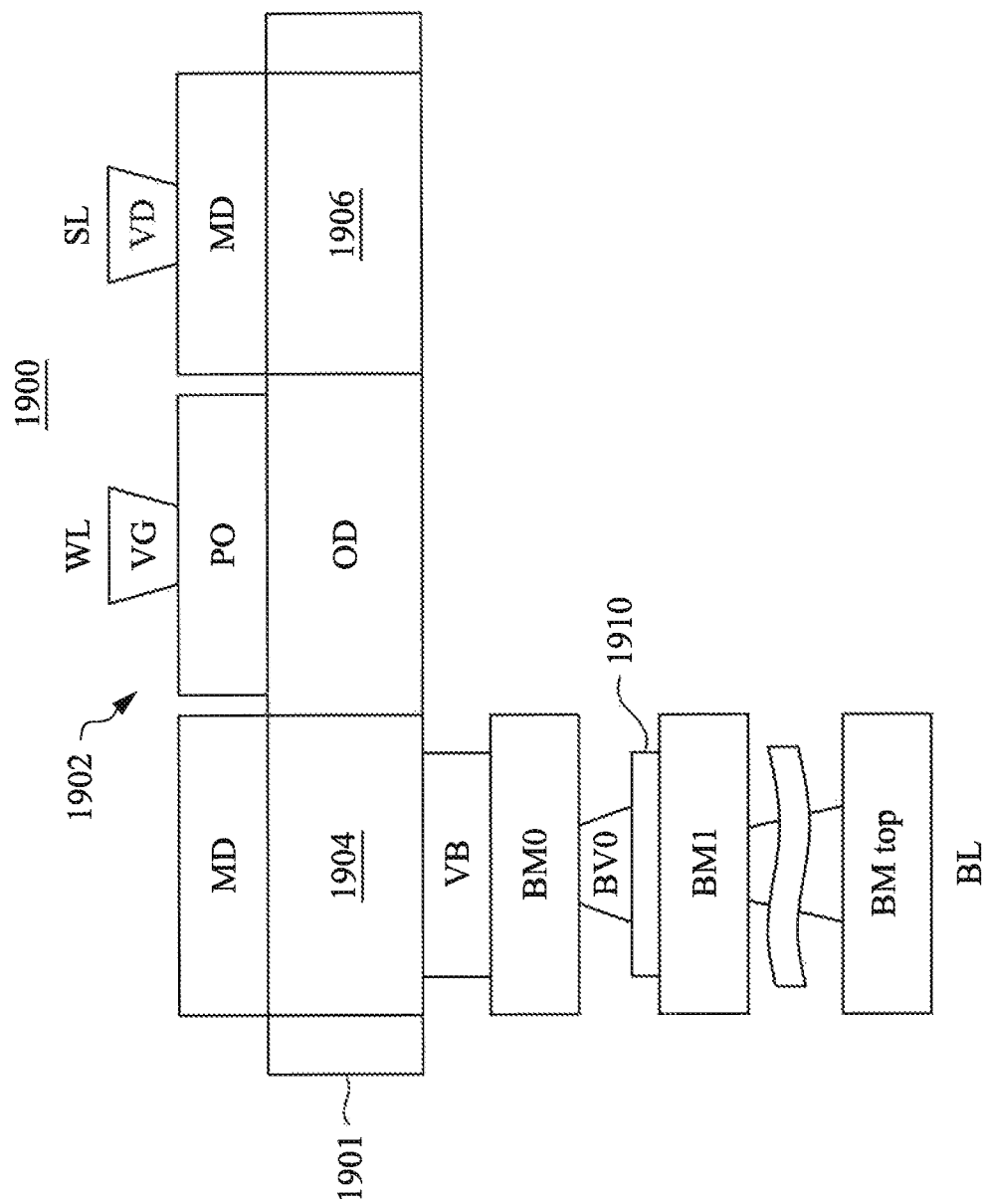

FIG. 19 illustrates a cross-sectional view of a memory cell 1900, in accordance with some embodiments. The memory cell 1900 incudes a transistor 1902 (e.g., access transistor 204) and a resistor (e.g., fuse resistor 202) including a metal-based layer 1910. The memory cell 1900 is similar to the memory cell 300, except that the memory cell 1900 includes a backside power rail on a second side (e.g., backside) of a substrate 1901 in which the metal-based layer 1910 is disposed.

The transistor 1902 includes a gate structure PO, am S/D structure 1904 (e.g., drain of access transistor 204), and an S/D structure 1902 (e.g., source of access transistor 204).

The gate structure PO is electrically connected to the word line WL, the S/D structure 1906 is electrically connected to the source line SL, and the S/D structure 1904 is electrically connected to the bit line BL through a plurality of via structures VB, BV0, BV1, etc. and a plurality of backside interconnect structures BM0, BM1, etc.

The metal-based layer 1910 is disposed between the backside via structure BV0 and the backside interconnect structure BM1. Specifically, the metal-based layer 1910 is disposed below a bottom surface of the backside via structure BV0 and a top surface of the backside interconnect structure BM1. Accordingly, the resistor of the memory cell 1900 includes a first terminal, including the backside via structure BV0, the backside interconnect structure BM0 and the backside via structure VB, a second terminal including the backside interconnect structure BM1, etc. disposed below the metal-based layer 1910, and the metal-based layer 1910 disposed between the first and second terminals. The first terminal is electrically connected to the S/D structure 1904, and the second terminal is electrically connected to the bit line BL.

Although FIG. 19 shows that the metal-based layer 1910 is disposed between the backside via structure BV0 and the backside interconnect structure BM1, embodiments are not limited thereto. For example, the metal-based layer 1910 can be disposed between any backside via structure BVX and any backside interconnect structure BMX that is the first backside via structure disposed below the backside via structure BVX. For example, the metal-based layer 1910 can be disposed between the backside via structure BV1 and the backside interconnect structure BM2, and so on and so forth.

Figure 20:
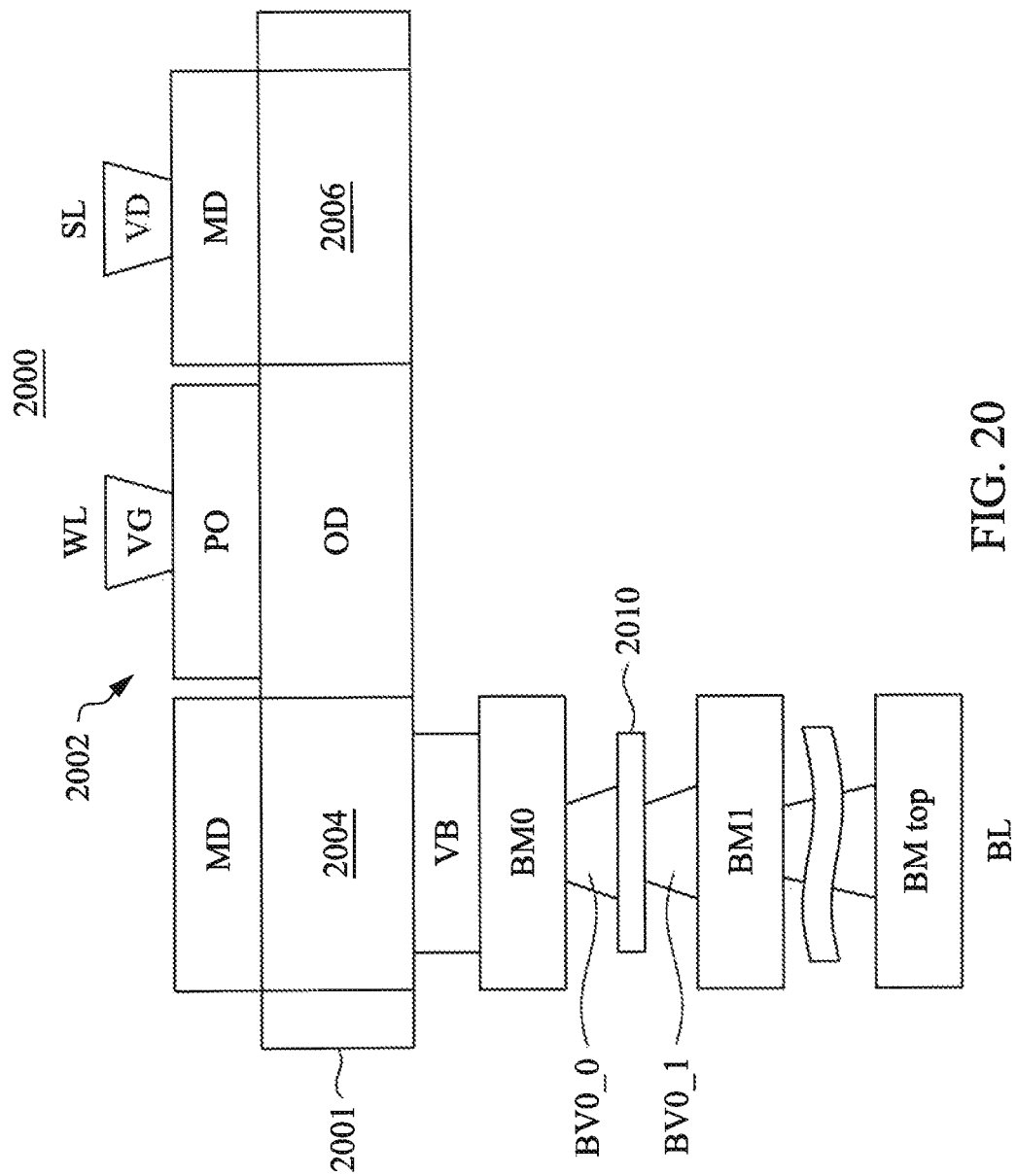

FIG. 20 illustrates a cross-sectional view of a memory cell 2000, in accordance with some embodiments. The memory cell 2000 includes a transistor 2002 (e.g., access transistor 204) and a resistor (e.g., fuse resistor 202) including a metal-based layer 2010. The memory cell 2000 is similar to the memory cell 300, except that the memory cell 2000 includes a backside power rail on a second side (e.g., backside) of a substrate 2001 in which the metal-based layer 2010 is disposed.

The transistor 2002 includes a gate structure PO, am S/D structure 2004 (e.g., drain of access transistor 204), and an S/D structure 2002 (e.g., source of access transistor 204). The gate structure PO is electrically connected to the word line WL, the S/D structure 2006 is electrically connected to the source line SL, and the S/D structure 2004 is electrically connected to the bit line BL through a plurality of via structures VB, BV0, BV1, etc. and a plurality of backside interconnect structures BM0, BM1, etc.

The metal-based layer 2010 is disposed between a first portion BV0_0 of the backside via structure BV0 and a second portion BV0_1 of the backside via structure BV0. Specifically, the metal-based layer 2010 is disposed below a bottom surface of the first portion BV0_0 and a top surface of the second portion BV0_1. Accordingly, the resistor of the memory cell 2000 includes a first terminal, including the first portion BV0_0, the backside interconnect structure BM0 and the backside via structure VB, a second terminal including the second portion BV0_1, the backside interconnect structure BM1, etc. disposed below the metal-based layer 2010, and the metal-based layer 2010 disposed between the first and second terminals. The first terminal is electrically connected to the S/D structure 2004, and the second terminal is electrically connected to the bit line BL.

Although FIG. 20 shows that the metal-based layer 2010 is disposed between the first portion BV0_0 and the second portion BV0_1 of the backside via structure BV0, embodiments are not limited thereto. For example, the metal-based layer 2010 can be disposed in between two portions of a backside via structure BVX. For example, the metal-based layer 2010 can be disposed between a first portion VB_0 and a second portion VB_1 of the backside via structure VB, and so on and so forth.

In one aspect of the present disclosure, a memory device is disclosed. The memory device includes a transistor; and a resistor electrically connected to the transistor, the transistor and the resistor forming a first OTP memory cell, wherein the resistor includes a metal-based layer with a resistivity configured to irreversibly transition from a first resistance state to a second resistance state In another aspect of the present disclosure, a memory device is disclosed. The memory device includes a transistor; a resistor electrically coupled to the transistor, the transistor and the resistor forming an eFuse memory cell; a plurality of interconnect structures formed over a source/drain structure of the transistor; and a plurality of via structures formed over the source/drain structure of the transistor. The resistor is disposed between the source/drain structure of the transistor and a topmost one of the plurality of interconnect structures, and the resistor is formed of TiN In yet another aspect of the present disclosure, a memory array is disclosed. The memory array includes a substrate; and a memory array disposed over the substrate and comprising a plurality of OTP memory cells, each of the OTP memory cells comprising a transistor and a resistor electrically connected to each other. The resistor of each of the OTP memory cells is formed of a metal-based material configured to present a low resistance state prior to programming the corresponding memory cell and a high resistance state in response to programming the corresponding memory cell The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
 a transistor;
 a resistor electrically coupled to the transistor, the transistor and the resistor forming an electrical fuse (eFuse) memory cell;
 a plurality of interconnect structures formed over a source/drain structure of the transistor; and
 a plurality of via structures formed over the source/drain structure of the transistor,
 wherein the resistor is disposed between the source/drain structure of the transistor and a topmost one of the plurality of interconnect structures,
 wherein the resistor is disposed directly above the source/drain structure of the transistor and directly below a bottom surface of a bottommost one of the plurality of interconnect structures, or directly above a top surface of the bottommost one of the plurality of interconnect structures and directly below a bottom surface of a bottommost one of the plurality of via structures, and
 wherein the resistor is formed of titanium nitride (TiN).

2. The memory device of claim 1, wherein the one of the plurality of interconnect structures is a first interconnect structure, and wherein a width of the resistor is different than a width of the bottom surface of the first interconnect structure.

3. The memory device of claim 1, wherein the one of the plurality of interconnect structures is a first interconnect structure, and wherein a width of the resistor is substantially the same as a width of the bottom surface of the first interconnect structure.

4. The memory device of claim 1, wherein a width of the resistor is different than a width of the bottom surface of at least one of the plurality of via structures.

5. The memory device of claim 1, wherein a width of the resistor is substantially the same as a width of the bottom surface of at least one of the plurality of via structures.

6. The memory device of claim 1, wherein the resistor is disposed directly on a top surface of a conductive structure that is formed directly on the source/drain structure of the transistor.

7. The memory device of claim 1, wherein a first via structure of the plurality of via structures includes a first portion and a second portion, wherein the resistor is interposed between the first and second portions of the first via structure.

8. A method, comprising:
forming a transistor;
forming a resistor including a metal-based layer with a resistivity configured to irreversibly transition from a first resistance state to a second resistance state, wherein the resistor is electrically coupled to the transistor to form an electrical fuse (eFuse) memory cell;
forming a plurality of interconnect structures over a source/drain (S/D) structure of the transistor; and
forming a plurality of via structures over the S/D structure of the transistor,
wherein the metal-based layer is disposed between the S/D structure of the transistor and a topmost one of the plurality of interconnect structures, and
wherein the metal-based layer is disposed directly above the S/D structure of the transistor and directly below a bottom surface of a bottommost one of the plurality of interconnect structures, or directly above a top surface of the bottommost one of the plurality of interconnect structures and directly below a bottom surface of a bottommost one of the plurality of via structures.

9. The method of claim 8, wherein forming the plurality of interconnect structures comprises:
forming a first interconnect structure coupled to the S/D structure of the transistor, wherein the metal-based layer is disposed with respect to the first interconnect structure.

10. The method of claim 9, wherein the metal-based layer is interposed between the first interconnect structure and the S/D structure.

11. The method of claim 9, wherein the metal-based layer is disposed above the first interconnect structure.

12. The method of claim 9, further comprising:
forming a plurality of metallization layers disposed over the first interconnect structure, wherein the metal-based layer is disposed within one of the plurality of metallization layers.

13. The method of claim 12, wherein each of the plurality of metallization layers includes an interconnect structure located farther than the metal-based layer to the transistor, and the metal-based layer is located farther than a via structure of the plurality of via structures to the transistor.

14. The method of claim 12, wherein a via structure of the plurality of via structures is located farther than the metal-based layer from the transistor, and the metal-based layer is located farther than an interconnect structure of each of the plurality of metallization layers from the transistor.

15. The method of claim 8, wherein forming the plurality of via structures comprises:
forming a via structure coupled to the transistor, wherein the via structure has a first portion connected to a first interconnect structure and a second portion connected to a second interconnect structure, and wherein the resistor is disposed between the first and second portions of the via structure.

16. A memory device, comprising:
a substrate; and
a memory array disposed over the substrate and comprising a plurality of one-time programmable (OTP) memory cells, each of the OTP memory cells comprising:
a transistor;
a resistor electrically coupled to the transistor to form an electrical fuse (eFuse) memory cell,
a plurality of interconnect structures formed over a source/drain structure of the transistor; and
a plurality of via structures formed over the source/drain structure of the transistor,
wherein the resistor is disposed directly above the source/drain structure of the transistor and directly below a bottom surface of a bottommost one of the plurality of interconnect structures, or directly above a top surface of the bottommost one of the plurality of interconnect structures and directly below a bottom surface of a bottommost one of the plurality of via structures.

17. The memory device of claim 16, wherein the resistor is disposed between the source/drain structure of the transistor and a topmost one of the plurality of interconnect structures.

18. The memory device of claim 16, wherein the resistor is formed of titanium nitride (TiN).

19. The memory device of claim 16, wherein the one of the plurality of interconnect structures is a first interconnect structure, and wherein a width of the resistor is different than a width of the bottom surface of the first interconnect structure.

20. The memory device of claim 16, wherein the one of the plurality of interconnect structures is a first interconnect structure, and wherein a width of the resistor is substantially the same as a width of the bottom surface of the first interconnect structure.

* * * * *